United States Patent
Alford et al.

(10) Patent No.: US 7,411,467 B2
(45) Date of Patent: Aug. 12, 2008

(54) OVERTONE CRYSTAL OSCILLATOR AUTOMATIC CALIBRATION SYSTEM

(75) Inventors: Ronald C. Alford, Austin, TX (US);
Gary A. Kurtzman, Austin, TX (US);
Shobak R. Kythakyapuzha, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 18 days.

(21) Appl. No.: 11/467,791

(22) Filed: Aug. 28, 2006

(65) Prior Publication Data

US 2008/0068106 A1    Mar. 20, 2008

(51) Int. Cl.
*H03B 5/32* (2006.01)

(52) U.S. Cl. .................. 331/158; 331/44; 331/116 R

(58) Field of Classification Search ............. 331/44, 331/116 R, 116 FE, 108 C, 154, 158, 160, 331/185, 186
See application file for complete search history.

(56) References Cited

U.S. PATENT DOCUMENTS

| | | |
|---|---|---|
| 4,959,624 A | 9/1990 | Higgins, Jr. et al. |
| 5,081,430 A | 1/1992 | Kohsiek |
| 6,172,575 B1 * | 1/2001 | Shinmori ............ 331/116 FE |
| 6,556,094 B2 * | 4/2003 | Hasegawa et al. ........ 331/158 |
| 2005/0206463 A1 | 9/2005 | Godambe et al. |

FOREIGN PATENT DOCUMENTS

| | | | |
|---|---|---|---|
| JP | 05299938 A | * | 11/1993 |
| WO | 02065631 A1 | | 8/2002 |
| WO | 2004054090 A1 | | 6/2004 |

\* cited by examiner

*Primary Examiner*—Robert J. Pascal
*Assistant Examiner*—Ryan J. Johnson
(74) *Attorney, Agent, or Firm*—Gary R Stanford

(57) ABSTRACT

An overtone crystal oscillator automatic calibration system including an overtone crystal oscillator with multiple programmable resistors and multiple amplifiers with supply voltage inputs and a calibration system. The calibration system adjusts the programmable resistors and the supply voltage inputs and detects oscillation of the overtone crystal oscillator. The calibration system adjusts the programmable resistors and the supply voltage input for each of multiple sequential steps to adjust the frequency bandwidth, such as from a higher bandwidth and lower gain to a lower bandwidth at higher gain. For example, each resistance level is tested for each of multiple supply voltage levels. The range of resistances and voltages is designed to ensure oscillation at a selected overtone frequency while avoiding oscillation at a fundamental frequency of the oscillator crystal. Oscillation may be detected by a counter which counts to a predetermined count value indicating successful oscillation.

21 Claims, 4 Drawing Sheets

US 7,411,467 B2

OVERTONE CRYSTAL OSCILLATOR AUTOMATIC CALIBRATION SYSTEM

CROSS-REFERENCE TO RELATED APPLICATIONS

The present application is related to co-pending U.S. patent application Ser. No. 11/457,580, entitled "Coil-less Overtone Crystal Oscillator" filed on Jul. 14, 2006, which has a common assignee and at least one common inventor, and which is herein incorporated by reference in its entirety for all intents and purposes.

BACKGROUND OF THE INVENTION

1. Field of the Invention

The present invention relates in general to oscillators, and more specifically to an automatic calibration system for an overtone crystal oscillator.

2. Description of the Related Art

A phase-locked loop (PLL) is a basic building block in many electronic circuits, including communication systems and the like, for providing requisite operating frequencies. A timing reference, such as a crystal oscillator, provides a reference frequency $F_{REF}$ which is multiplied by a PLL circuit to achieve a higher output frequency $F_{OUT}$. Crystal oscillators are highly accurate and thus are often used for providing the reference frequency. It is desired to provide a crystal oscillator having its reference frequency ($F_{REF}$) as high as possible. Higher crystal oscillator reference frequencies allow for lower synthesizer close-in phase noise, lower loop divider ratios, and wider PLL bandwidths. The wider PLL bandwidths allow for lower cost and complexity when supporting wider modulation bandwidths in communications systems. Inverted-mesa crystals may be used to achieve higher frequencies, but tend to be delicate and expensive. An overtone crystal oscillator is often used to provide the timing reference at a relatively high frequency, such as 100 megahertz (MHz) or more, while avoiding the cost of an expensive inverted-mesa crystal.

An overtone crystal oscillator is an oscillator using a crystal having a fundamental mode of oscillation which is suppressed by additional circuitry, where the additional circuitry is further designed to ensure oscillation at a higher harmonic frequency, otherwise called the overtone. The oscillator is designed to cause the overtone crystal to oscillate at odd harmonic frequencies or overtones, such as the third overtone (3OT). In many conventional configurations a resonant inductor-capacitor (LC) circuit is employed to suppress oscillation at the fundamental frequency of the overtone crystal. A coil-less solution is known using differential bipolar transistor circuit topologies. In the ideal case, the components of the overtone crystal oscillator are manufactured within ideal tolerances to provide desired loop gain and frequency response to ensure oscillation upon startup at a specific overtone frequency of the overtone crystal. The ideally manufactured overtone crystal oscillator exhibits minimal operating current drain. As understood by those of ordinary skill in the art, however, significant process induced variations can and do occur during manufacturing. Such process induced variations alter loop gain and frequency response and may render the overtone crystal oscillator inoperative without some type of startup circuitry.

Conventional crystal oscillator startup circuits usually increase oscillator loop gain to ensure startup, but do not intentionally and significantly alter both the loop gain and frequency response to guarantee oscillator startup on a specific overtone frequency of the crystal. Substantial negative impact may result from process variance on startup behavior. Current drain goals for the overtone oscillator are difficult to obtain with sufficient startup margin over the process variation window. It is desired to substantially improve manufacturability and to reduce current drain of overtone reference oscillators in the presence of variance in semiconductor process and crystal loss. It is desired to provide an overtone crystal oscillator startup circuit which enables minimum current drain despite process and crystal loss variance.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
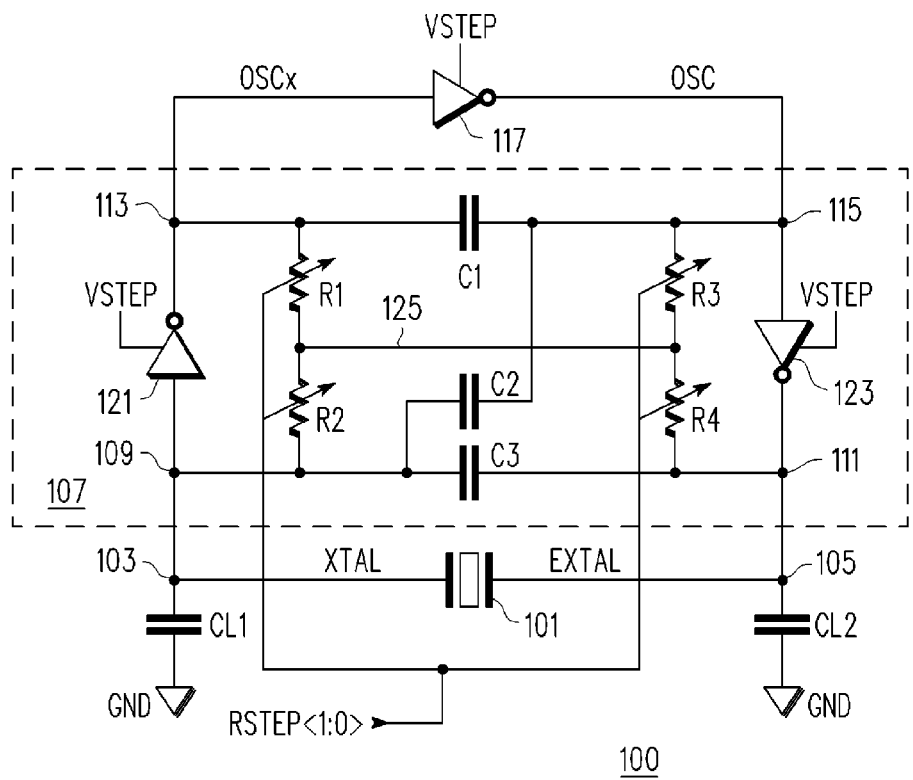
FIG. 1 is a schematic diagram of a coil-less overtone crystal oscillator that is used for purposes of illustrating an automatic calibration system implemented according to an exemplary embodiment of the present invention.

FIG. 1 is a schematic diagram of an overtone crystal oscillator 100, having an architecture similar to that disclosed in related U.S. patent application Ser. No. 11/457,580, entitled "Coil-less Overtone Crystal Oscillator," which is herein incorporated by reference in its entirety for all intents and purposes. The overtone crystal oscillator 100 is a coil-less overtone oscillator solution used to illustrate an automatic calibration system implemented according to an exemplary embodiment of the present invention. The overtone crystal oscillator 100 includes an overtone crystal 101 having two terminals coupled to nodes 103 and 105, respectively, having signal names XTAL and EXTAL, respectively. A first load capacitor CL1 is coupled between node 103 and a reference node such as ground (GND) and a second load capacitor CL2 is coupled between node 105 and GND. Nodes 115 and 113 collectively provide a differential output oscillation signal with polarity signals OSC and OSCx, respectively. Node 103 is coupled to a first input node 109 of a resonant amplifier circuit 107 having a first output node 111 coupled to node 105. The resonant amplifier circuit 107 has another output node 113 coupled to an input of an inverting amplifier 117, which has an output coupled to another input node 115 of the resonant amplifier circuit 107.

The crystal 101 is manufactured with a fundamental resonant frequency. The overtone crystal oscillator 100 is implemented with the intended goal of establishing the conditions for oscillation known as the Nyquist criterion as understood by those skilled in the art. According to the Nyquist criterion, the closed-loop voltage gain is at least one (e.g., >0 decibels or dB) and the net closed loop phase shift is zero degrees (0° or a multiple of 360°). The crystal 101 is an overtone crystal having a fundamental resonant frequency that is significantly less than the target high frequency of interest. The crystal 101 is configured to oscillate at odd harmonic frequencies or overtones, such as the third overtone (3OT) or the fifth harmonic overtone (5OT), etc. For example, to achieve a 100 MHz overtone oscillator, the crystal 101 may have a fundamental resonant frequency of approximately 33 MHz. The overtone crystal oscillator 100 is designed to disable oscillation at the fundamental frequency and to enable or otherwise encourage oscillation at the selected overtone frequency.

In the illustrated configuration, the resonant amplifier circuit 107 is configured to suppress oscillation at the fundamental frequency of the crystal 101 and to ensure oscillation at a selected overtone frequency, such as the third overtone. The resonant amplifier circuit 107 includes an inverting amplifier 121 having its input coupled to the node 109 (for coupling to node 103) and its output coupled to node 113. The resonant amplifier circuit 107 includes another inverting amplifier 123 having its input coupled to the node 115 and its output coupled to node 111 (for coupling to node 105). A resistor-capacitor (RC) network is coupled to the inverting amplifier 121 and 123. In particular, a first pair of resistors R1 and R2 is coupled in series between nodes 109 and 113 and a second pair of resistors R3 and R4 is coupled in series between nodes 111 and 115. The intermediate nodes of the pairs of resistors R1, R2 and R3, R4 are coupled together at a node 125. A first capacitor C1 is coupled between the output of the inverting amplifier 121 and the input of the inverting amplifier 123. A second capacitor C2 is coupled between the inputs of the inverting amplifiers 121 and 123. And a third capacitor C3 is coupled between the output of the inverting amplifier 123 and the input of the inverting amplifier 121.

As described further in the related disclosure, the inverting amplifiers 121, 117 and 123 along with the RC network (including the load capacitors CL1 and CL2) collectively form a closed-loop phase shift versus frequency characteristic that suppresses the fundamental frequency of the overtone crystal 101 while ensuring oscillation at a selected overtone frequency. One benefit of the overtone crystal oscillator 100 is that an inductor is not necessary to suppress the fundamental frequency. An LC circuit used in many conventional configurations, for example, uses an external or internal inductor, which adds extra material and manufacturing cost, printed circuit board (PCB) space or IC area, and potentially enables undesired coupling to or from nearby circuitry of the electronic device. Another benefit of the illustrated overtone crystal oscillator is that each component (other than the crystal 101) may be implemented in a standard complementary metal oxide semiconductor (CMOS) process. Certain conventional coil-less solutions employ differential bipolar transistor circuit topologies that provide limited sideband noise performance. CMOS processes, however, provide limited support for bipolar configurations and bipolar configurations are not supported by the more recent generations of fine-line CMOS-only process technologies. The overtone crystal oscillator 100 may be integrated onto a CMOS chip, where the crystal 101 is provided as an external component externally coupled to the chip. It is understood, however, that an automatic calibration system implemented according to an embodiment of the present invention is not limited to the overtone crystal oscillator 100 or coil-less overtone oscillators in general but instead may be used as the startup circuit for any coil-based or coil-less overtone crystal oscillator.

In the ideal case, the components of an overtone crystal oscillator, including the overtone crystal oscillator 100, for example, are manufactured within ideal variations or tolerances to provide desired loop gain and frequency response to ensure oscillation upon startup at a specific overtone frequency of the overtone crystal (e.g., the crystal 101). The ideally manufactured overtone crystal oscillator exhibits minimal operating current drain. As understood by those of ordinary skill in the art, however, significant process induced variations can and do occur during manufacturing. Such process induced variations alter loop gain and frequency response and may render the overtone crystal oscillator inoperative. An automatic calibration system according to that described herein allows for startup conditions to be met at the desired overtone frequency and prevents oscillation at the fundamental mode, despite large process induced variations in loop gain and frequency response. An automatic calibration system according to that described herein allows sequential adaptation of the closed-loop gain and phase response of the oscillator. The calibration adaptation process described herein proceeds from wider loop bandwidth, low current and low gain states appropriate for low loss crystals and optimum semiconductor processing to lower loop bandwidth, higher current and higher gain states appropriate for higher loss crystals and sub-optimum semiconductor processing. The calibration adaptation terminates when startup is detected by a counter overflow mechanism. If for any reason startup of the oscillator does not occur, the calibration system provides a failure indication.

As illustrated by the overtone crystal oscillator 100, the resistors R1-R4 are implemented as adjustable or variable resistors programmed or adjusted by a two-bit digital state control signal RSTEP<1:0>. The binary value of the RSTEP<1:0> determines or otherwise programs the value of each of the resistors R1-R4. In one exemplary configuration, each of the resistors R1-R4 includes a bank of switched resistors controlled by the RSTEP<1:0> signal for switching in or out one or more resistors to achieve the desired resistance value of each resistor bank. Each resistor bank may include parallel or serial resistors or any suitable combination thereof. Alternative configurations are possible and contemplated as known to those of ordinary skill in the art. The inverting amplifiers 117, 121 and 123 receive an amplifier supply voltage VSTEP, which is adjustable within a predetermined range of voltages to ensure oscillation upon startup of the overtone crystal oscillator 100. The level of the supply voltage of each amplifier modifies its operating characteristics (e.g., switching speed, gain, frequency response, etc.) as understood by those of ordinary skill in the art thereby adjusting the closed loop characteristics of the overtone crystal oscillator 100.

Figure 2:
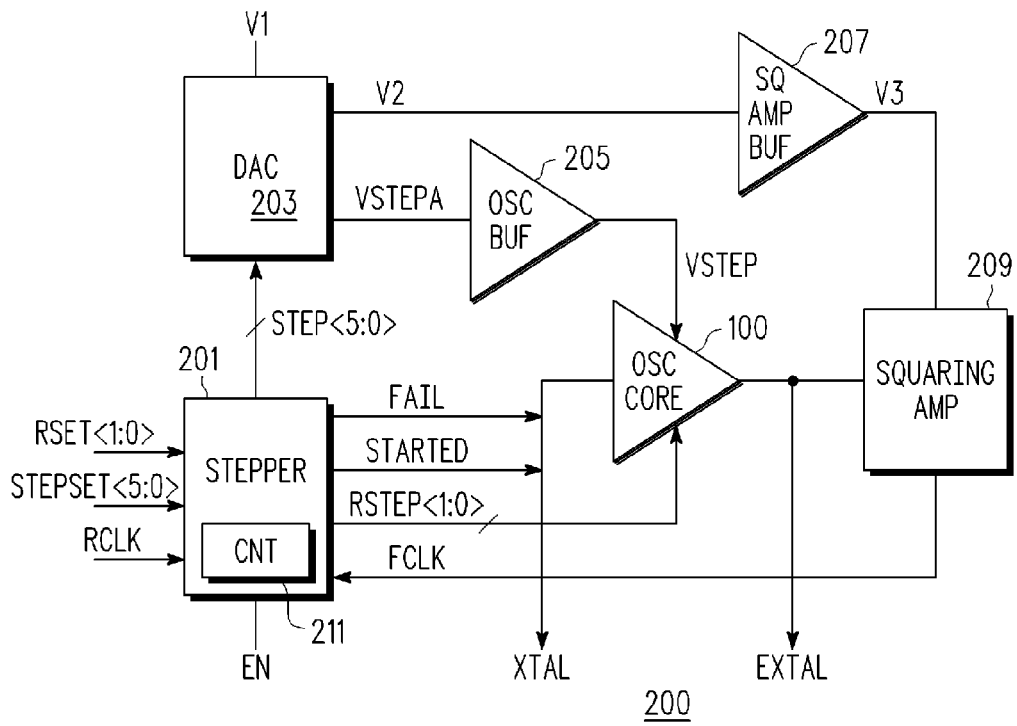
FIG. 2 is a simplified block diagram of an oscillator circuit including the overtone crystal oscillator of FIG. 1 coupled to an automatic calibration system implemented according to an exemplary embodiment of the present invention.

FIG. 2 is a simplified block diagram of an oscillator circuit 200 including the overtone crystal oscillator 100 coupled to an automatic calibration system implemented according to an exemplary embodiment of the present invention. The primary components of the automatic calibration system include a stepper circuit 201, a digital to analog converter (DAC) 203, an oscillator buffer (OSC BUF) 205, a squaring amplifier buffer (SQ AMP BUF) 207, and a squaring amplifier (SQ AMP) 209. Additional supporting circuitry (not shown) may be provided. The stepper circuit 201 receives a clock signal RCLK, an enable signal EN, a feedback clock signal FCLK, and a pair of programmable input state control values including a two-bit resistance set value RSET<1:0> and a six-bit operating state set value STEPSET<5:0>. The stepper circuit 201 generates and provides the RSTEP<1:0> signal to the overtone crystal oscillator 100 and generates a six-bit digital state sequence value STEP<5:0>. The stepper circuit 201 increments or adjusts the binary value of the STEP<5:0> signal to step through a predetermined 16 step automatic calibration sequence for setting the programmable resistance and supply voltage for the overtone crystal oscillator 100. The STEP<5:0> signal is shown having six bits, which includes at least four bits for sequencing through 16 predetermined steps or states. The STEP<5:0> signal may have additional bits for defining any auxiliary or control states if desired. For example, one or more bits may be used to set up, enter and/or exit the automatic calibration process while four bits are used to define each of the 16 states. The stepper circuit 201 includes a counter 211 which counts clock pulses of the FCLK signal and develops a count value CNT.

As described further below, the CNT value is used for determining successful startup operation of the overtone crystal oscillator 100. The stepper circuit 201 advances through the sequential states until a predetermined minimum number of clock pulses, referred to as MINCNT, is detected on the FCLK signal. Thus, if the CNT value reaches or exceeds MINCNT during the automatic calibration sequence, the stepper circuit 201 terminates the sequence, asserts a STARTED indication or flag, and then holds the final programming state to maintain oscillation. If the stepper circuit 201 advances through all of the sequential states and CNT does not reach MINCNT, then operation terminates and a failure indication or flag FAIL is asserted to inform other circuitry (not shown) that oscillation has not been achieved. In one embodiment, MINCNT is set to a suitable number to indicate successful oscillation of the overtone crystal oscillator 100, such as, for example, 512.

The STEP<5:0> signal is provided to an input of the DAC 203, which outputs an amplifier supply voltage level VSTEPA, where the voltage level of VSTEPA is adjusted according to the binary value of the STEP<5:0> signal. The VSTEPA voltage is provided to the input of the oscillator buffer 205, which provides the amplifier supply voltage VSTEP at its output. The VSTEP voltage is a buffered version of the VSTEPA signal, so that the supply voltage of the amplifiers 117, 121 and 123 within the overtone crystal oscillator 100 is adjusted based on the STEP<5:0> signal. The stepper circuit 201 also adjusts the binary value of the RSTEP<1:0> signal to adjust the resistance of the resistors R1-R4 within the overtone crystal oscillator 100. The DAC 203 receives a supply voltage V1 and outputs a voltage V2 to an input of the squaring amplifier buffer 207. The squaring amplifier buffer 207 outputs a supply voltage V3 to the supply input of the squaring amplifier 209, where the voltage V3 is a buffered version of the V2 voltage. The EXTAL signal developed on node 105 of the overtone crystal oscillator 100 is provided to an input of the squaring amplifier 209, which generates the FCLK signal. In operation, if and when the overtone crystal oscillator 100 begins oscillating, pulses on the EXTAL signal are squared up by the squaring amplifier buffer 207 and asserted to a voltage level determined by the voltage V3 for generating the FCLK signal. As noted above, the counter 211 counts the pulses of the FCLK signal for determining successful startup operation. If CNT reaches or exceeds MINCNT during the automatic calibration process, then the STARTED flag is asserted. Otherwise, the FAIL flag is asserted indicating that oscillation has not been achieved.

The EN signal is asserted high to bypass the automatic calibration sequence and instead establish operation as determined by binary values of the RSET<1:0> and STEPSET<5:0> signals. In particular, when EN is high, the value of RSET<1:0> is passed to the RSTEP<1:0> signal and the value of STEPSET<5:0> is passed to the STEP<5:0> signal and the automatic calibration process is not performed. Such default or predetermined values may be employed if the appropriate or desired operating state for successful oscillation is known or otherwise predetermined. When the EN signal is asserted low, the stepper circuit 201 ignores the RSTEP<1:0> and STEPSET<5:0> signals and sequences the STEP<5:0> and RSTEP<1:0> signals to perform automatic calibration as further described below.

The clock signal RCLK may be supplied from an external or off-chip source or RCLK may be provided from an on-chip oscillator, such as a relatively simple RC oscillator or the like. In either case, it is noted that RCLK need not be a high-precision reference clock signal and can be provided from any low precision, noisy source since it serves only to drive the stepper circuit 201 through the automatic calibration sequence. RCLK may even be disabled when the calibration sequence is completed. Furthermore, RCLK is a relatively low frequency clock compared to the frequency level of the precision clock generated by the overtone crystal oscillator 100 (i.e., such as by a large factor e.g., several thousands). In the illustrated configuration, RCLK is approximately 32 KHz whereas the overtone crystal oscillator oscillates at approximately 100 MHz. In the present case, RCLK is simply used to advance the calibration sequence and clock the stepper 201 so that it may be a relatively noisy and non-precise clock signal.

Figure 3:
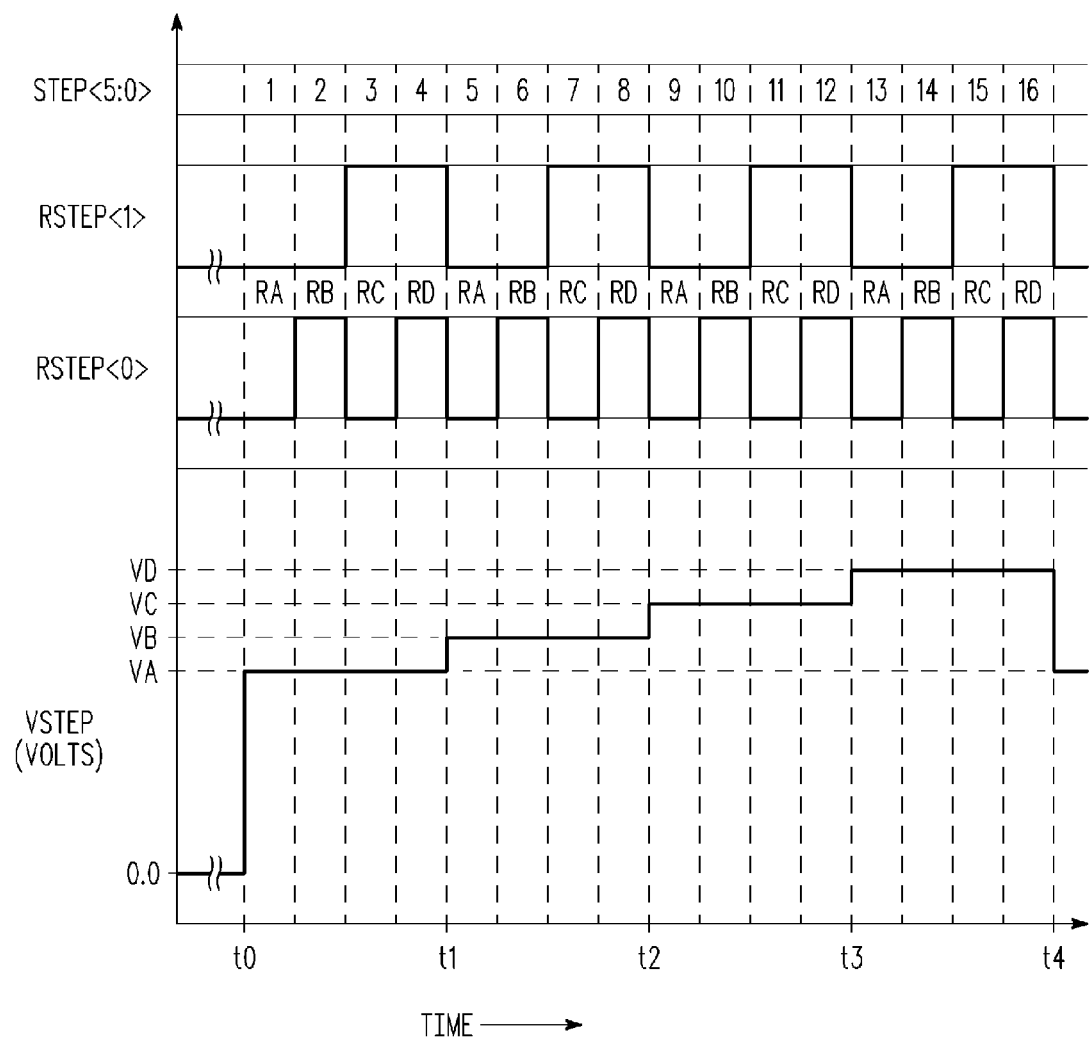
FIG. 3 is a graphic diagram plotting the state control signals versus time along with the indicated resistance values RA-RD and the supply voltage values VA-VD versus time.

FIG. 3 is a graphic diagram plotting the state control signals STEP<5:0> and RSTEP<1:0> along with the indicated resistance values RA-RD and the supply voltage value VSTEP versus time. The RSTEP<1> and RSTEP<0> signals are individually plotted to more clearly illustrate the binary counting sequence for the resistance values. The VSTEP signal steps through the voltages VA-VD in response to the STEP<5:0> signal as further described herein. The STEP<5:0> signal is shown at top as decimal numbers 1, 2, 3, ..., 16 indicating sequentially stepping through the 16 successive states beginning at a time t0. During the calibration process, the least significant bit (LSB) of the RSTEP<1:0> signal, or RSTEP<0>, toggles with each successive state of STEP<5:0> while the most significant bit (MSB) toggles with every other successive state. In this manner, the RSTEP<1:0> signal sequentially cycles through the four binary states 00b, 01b, 10b, and 11b (where a "b" appended to the value indicates a binary value) to define four separate resistance values RA, RB, RC and RD, respectively, for each of the resistors R1-R4 in a round-robin fashion. In this case, each of the resistors R1-R4 has substantially equal resistance values in each state. After reaching resistance RD, the sequence "increments" back to RA and repeats in cyclical fashion. Thus, as the value of the RSTEP<1:0> signal is advanced through its sequential binary values 00b, 01b, 10b, 11b, 00b, 01b, etc., the resistance of the resistors R1-R4 advances through the resistance values RA, RB, RC, RD, RA, RB, etc., respectively.

At the beginning of the calibration process, the DAC 203 (via the oscillator buffer 205) asserts the VSTEP voltage to a first voltage VA and holds this voltage level for the first four states 1-4. During the first four states, the stepper circuit 201 advances the RSTEP<1:0> signal through its four binary states 00b-11b as described above, for testing each resistance value from RA-RD while VSTEP is held at voltage level VA. The duration of each state throughout the entire calibration process allows sufficient time for the overtone crystal oscillator 100 to ramp up oscillations, for the squaring amplifier 209 to square up the FCLK signal, for the stepper circuit 201 and the counter 211 to detect and count at least MINCNT clock cycles assuming appropriate oscillation has been achieved, and for the stepper circuit 201 to terminate the automatic calibration process upon successful detection of oscillation. If in any state oscillation is achieved such that the counter 211 counts at least MINCNT cycles of FCLK, then the automatic calibration is suspended and the states of the STEP<5:0> and RSTEP<1:0> signals are held to maintain oscillation. If oscillation is not achieved in the first four states 1-4, then at a time t1 the DAC 203 increases the voltage level of VSTEP to a new voltage level VB in response to the STEP<5:0> advancing to state 5. And the DAC 203 holds VSTEP at VB for the next four states 5-8. Meanwhile, the stepper circuit 201 advances the RSTEP<1:0> signal back to 00 so that the resistance of the resistors R1-R4 goes back to resistance RA, and then advances through each of the resistances RA-RD again while the voltage level of VSTEP is at VB. Operation repeats in similar manner at a time t2 if oscillation is not yet achieved, at which time the DAC 203 increases the voltage level of VSTEP to VC and the stepper circuit 201 tests each resistance value RA-RD while at voltage level VC. And at a time t3, if oscillation is not yet achieved, the DAC 203 increases the voltage level of VSTEP to VC and the stepper circuit 201 tests each resistance value RA-RD while at voltage level VD. In the illustrated configuration, if oscillation is not achieved after testing all resistive states at each voltage level at a time t4, calibration operation terminates and the FAIL flag is set. It is appreciated that more or less calibration steps may be employed. For example more or less than four different voltage steps and four different resistance values may be used depending upon the particular configuration.

In the illustrated configuration, each resistance value is tested at each voltage level, where the resistance and voltage ranges and/or discrete values thereof are selected to maximize the likelihood of oscillation for the particular configuration of the overtone crystal oscillator 100 and the manufacturing process used. The lowest voltage level VA and the least resistance value RA provides the widest loop frequency bandwidth, the lowest current drain and the lowest gain state for the overtone crystal oscillator 100. Each successively larger value of supply voltage and/or resistance reduces frequency bandwidth, increases current drain and increases gain state. The lower supply voltages and resistances are appropriate for low loss crystals and optimum semiconductor processing whereas the higher voltages and resistances are appropriate for higher loss crystals and sub-optimum semiconductor processing. The automatic calibration adaptation process, therefore, begins at potentially optimal values for optimal manufacturing conditions and incrementally increases the voltage and resistance values until the appropriate combination of supply voltage and resistance establishes the appropriate closed-loop gain and phase response for the particular manufactured overtone crystal oscillator 100. And when the appropriate supply voltage and resistance is achieved, the overtone crystal oscillator 100 begins oscillating as detected by the counter overflow mechanism. If for any reason oscillation does not occur, the calibration system provides a failure indication.

Figure 4:
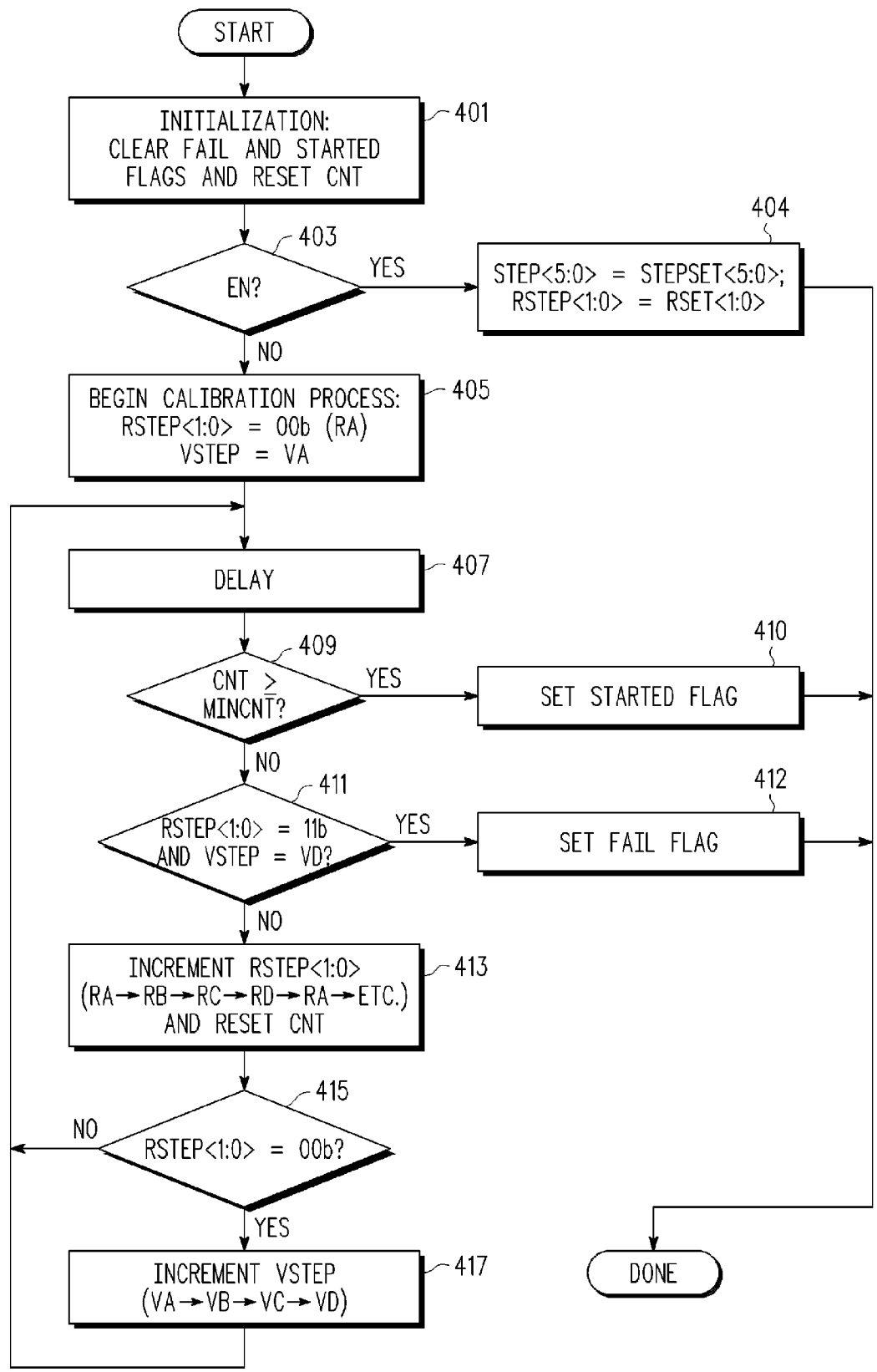
FIG. 4 is a flowchart diagram illustrating operation of the oscillator circuit of FIG. 2 including the overtone crystal oscillator of FIG. 1 coupled to the automatic calibration system.

FIG. 4 is a flowchart diagram illustrating operation of the oscillator circuit 200 including the overtone crystal oscillator 100 coupled to the automatic calibration system. At a first block 401, an initialization process is performed upon startup or power up of the system or integrated circuit incorporating the oscillator circuit 200. The initialization process includes clearing the FAIL and STARTED flags and clearing or resetting the count value CNT. At next block 403, it is queried whether the EN signal is asserted high. If so, then operation proceeds to block 404 in which the value of STEP<5:0> is set equal to STEPSET<5:0> and the value of RSTEP<1:0> is set equal to RSET<1:0> and operation is completed. In this case, the stepper circuit 201 transfers the RSET and STEPSET values to the RSTEP and STEP signals, respectively, and the automatic calibration process is bypassed. If the EN signal is not asserted high, operation instead proceeds to block 405 in which the calibration process is initiated including setting RSTEP<1:0> to 00b (so that the resistors R1-R4 are each set to RA) and in which VSTEP is set to the VA voltage level. This initial step corresponds to the first state of the STEP<5:0> signal. In an actual configuration, the circuitry, logic, state machine(s), programming code, etc., implementing the oscillator circuit 200 sets the STEP<5:0> signal to the value associated with the first state, and the DAC 203 converts the value of STEP<5:0> into the appropriate value for VSTEPA (converted to VSTEP by the oscillator buffer 205) and the stepper circuit 201 converts the value of STEP<5:0> into the appropriate value for RSTEP<1:0> to perform the calibration process.

Each step of the automatic calibration process includes a sufficient amount of time or delay as represented by next block 407. In the configuration of the oscillator circuit 200 of FIG. 2, the frequency of the RCLK signal is used directly or multiplied or divided down by a sufficient amount so that each calibration step includes a sufficient amount of time for the overtone crystal oscillator 100 to ramp up oscillations, for the squaring amplifier 209 to square up the FCLK signal, for the stepper circuit 201 including the counter 211 to detect and count at least MINCNT clock cycles assuming appropriate oscillation has been achieved, and for the stepper circuit 201 to terminate the automatic calibration process upon successful detection of oscillation as previously described. The delay block 407 represents the predetermined amount of time for determining whether the overtone crystal oscillator 100 is oscillating with the given values of resistance and supply voltages. In one embodiment, the delay is approximately 500 microseconds (µs), although the actual amount of delay is adjusted for the particular configuration implemented. After the delay, operation proceeds to block 409 in which it is queried whether the CNT value has reached or exceeded MINCNT. If so, the successful oscillation has been verified and operation proceeds to block 410 in which the STARTED flag is set and operation is completed.

If CNT has not reached MINCNT as determined at block 409, operation proceeds instead to block 411 in which it is queried whether the value of RSTEP<1:0> is equal to 11b and VSTEP is equal to VD. If so, then all of the variations or discrete levels of resistance and supply voltage have been tried without success and operation proceeds to block 412 in which the FAIL flag is set and operation terminates. In the first and subsequent iterations except the last state, of course, this condition is not met so that operation instead proceeds to block 413 in which the value of RSTEP<1:0> is incremented to program the resistors R1-R4 to the next resistance value and CNT is reset. As shown and as previously described, the resistance values loop in round-robin fashion between resistances RA-RD. At next block 415, it is queried whether the value of RSTEP<1:0> is equal to 00b. If not, then not all of the discrete values of resistance have been tried for the given voltage level of VSTEP so that operation loops back to the delay block 407 to test the new resistance at the given voltage level of VSTEP. In this manner, operation loops through each of the discrete resistance values RA-RD for the same voltage level of VSTEP. If RSTEP<1:0> is equal to 00b as determined at block 415, then all of the discrete values of resistance have been tried for the given voltage level of VSTEP, so that operation proceeds instead to block 417 to increment VSTEP. As previously described, VSTEP is incremented through the voltage levels VA-VD, and for each voltage supply step, each of the resistances RA-RD is tested. After VSTEP is incremented at block 417, operation loops back to the delay block 407.

It is appreciated that each combination of resistances and voltage supply levels is tested in a predetermined order until either oscillation is achieved as determined at block 409 or until all combinations are tried without success as determined at block 411. If and when the CNT value reaches or exceeds MINCNT, then the STARTED flag is set and the successful combination of resistance and voltage supply levels are maintained by holding steady the values of the STEP<5:0> and RSTEP<1:0> signals. If CNT does not reach MINCNT after all combinations have been tried, then the FAIL flag is set and automatic calibration operation terminates.

Figure 5:
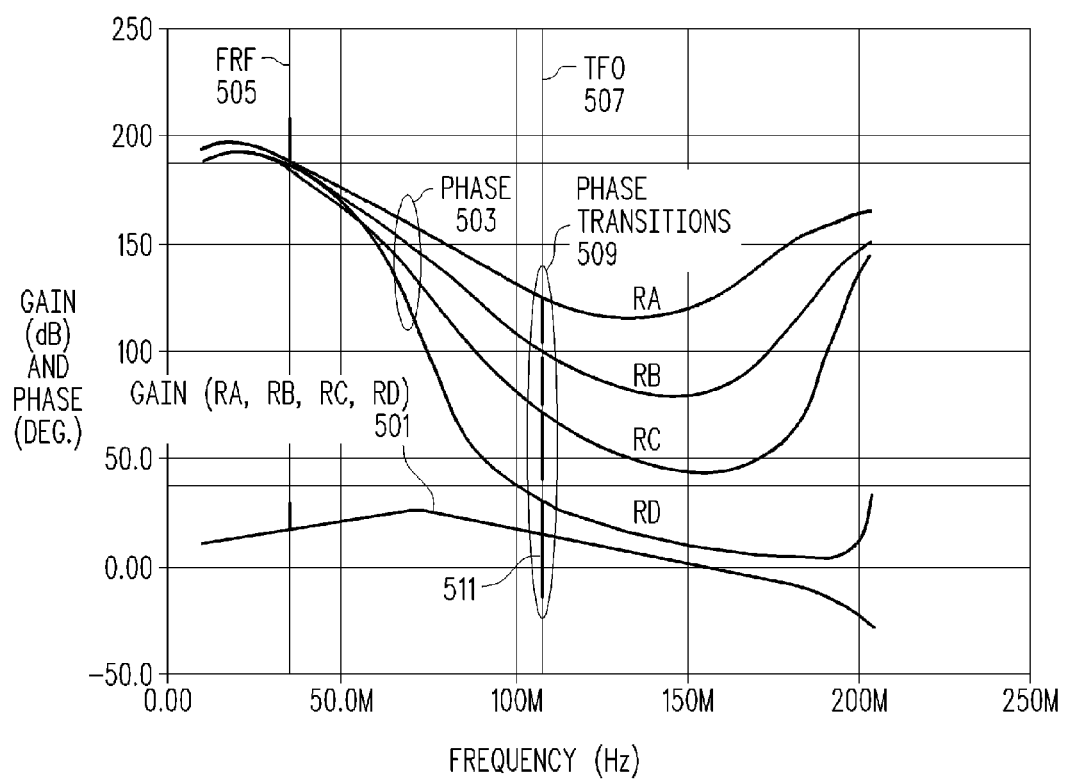
FIG. 5 is a graphic diagram plotting the closed-loop gain and phase characteristics of the overtone crystal oscillator of FIG. 1 versus frequency for each of four resistance values at a selected voltage level of VSTEP.

FIG. 5 is a graphic diagram plotting the closed-loop gain and phase characteristics of the overtone crystal oscillator 100 versus frequency for each of four resistance values RA-RD at a selected voltage level of VSTEP (e.g., VSTEP=1.2 Volts). A single gain curve (dB vs. frequency in Hertz (Hz)) is shown at 501 and four corresponding phase curves (degrees versus frequency in Hz) are shown at 503 for each of the four resistance values RA-RD. Although the gain curves do vary somewhat with changes of the resistances of the resistors R1-R4, such variations are minimal so that the single gain curve 501 is representative of each of the resistance values. The fundamental resonant frequency (FRF) of the crystal 101 is shown at 505. At the FRF 505, although the gain curve 501 is above 0 dB, all of the phase curves are well above zero degrees (e.g., approximately 180 degrees), so that the conditions for oscillation are not met. And it is further noted that the phase curves change only by a relatively small amount across all combinations of resistance at the FRF 505. As the frequency is increased towards the target frequency of oscillation (TFO) 507, the gain curve 501 remains above 0 dB whereas the phase curves begin to decrease. And the larger the resistance, the greater the decrease so that the phase curves begin to separate by an appreciable amount. Although none of the phase curves appear to drop below zero degrees at the TFO 507, each phase curve exhibits an abrupt phase transition due to resonance of the crystal 101 at the TFO 507 (shown collectively as phase transitions 509) in which each phase curve quickly decreases just before the TFO 507 and then quickly increases above the TFO 507. In spite of these phase transitions 509, the first three curves for resistances RA, RB and RC do not fall below zero degrees and thus do not meet the conditions for oscillation. The RD curve associated with the largest resistance, however, falls closer to zero degrees while approaching the TFO 507 and the phase transition 511 for the RD curve does fall below zero degrees while the gain curve 501 remains above 0 dB at the TFO 507. In this manner, the resistance RD causes the closed loop characteristics of the overtone crystal oscillator 100 to meet the conditions for oscillation.

In a very specific configuration for a target output frequency of approximately 100 MHz, the capacitance values of C1, C3, CL1 and CL2 are approximately 3 picofarads (pF) each and the capacitance value of C2 is approximately 1.5 pF. The resistances RA, RB, RC and RD are within the range of 100 to 1,000 ohms (Ω) each, such as, for example, 330, 395, 475 and 615Ω, or 500, 570, 650, and 800Ω, etc. The supply voltages VA, VB, VC and VD are within a range of approximately 1.0 to 1.5V, such as, for example, 1.1V, 1.2V, 1.3V and 1.4V. It is appreciated, however, that the supply voltages VA-VD and the resistance and capacitance values of may be adjusted accordingly for the particular overtone frequency of interest for the selected crystal 101. For example, the component values are adjusted to achieve the desired overtone frequency oscillation for a different crystal having a different fundamental frequency. Furthermore, it is possible to achieve oscillation at higher odd harmonic frequencies, such as the fifth overtone, the seventh overtone, etc., when the fundamental frequency and the intermediate overtones are suppressed.

Although the automatic calibration system is illustrated for calibrating a coil-less overtone crystal oscillator, it may be used to calibrate any type of overtone crystal oscillator with at least one programmable parameter for adjusting closed-loop gain and frequency response. In the illustrated embodiment, the at least one programmable parameter includes voltage supply inputs of oscillator amplifiers and resistances of an RC network coupled to the amplifiers. The voltages and resistances are adjusted from a high frequency bandwidth and low gain state to a low frequency bandwidth and high gain state to achieve optimal results. In the particular configuration, this is achieved by adjusting resistance from smallest to largest for each of multiple voltage levels also adjusted from lowest voltage level to largest voltage level. The particular ordering of voltages and resistances, however, may be modified if desired without departing from the spirit and scope of the present invention. The stepper circuit 201 and DAC 203 generally form sequential logic or circuitry which adjusts each programmable parameter through multiple binary states or steps. The counter 211 generally operates as a sensor which detects whether the overtone crystal oscillator has achieved successful oscillation. Detecting and counting cycles is a particularly convenient method although alternative oscillation detection methods are contemplated.

An automatic calibration system for an overtone crystal oscillator according to an embodiment of the present invention includes a calibration control circuit and a sensor. The overtone crystal oscillator has at least one programmable parameter for adjusting closed-loop frequency response of the overtone crystal oscillator and an oscillation node that oscillates upon oscillation of the overtone crystal oscillator. The calibration control circuit adjusts the programmable parameter through each of multiple steps associated with frequency bandwidth. The sensor detects whether the overtone crystal oscillator achieves oscillation at any step during the calibration process.

In one configuration, the programmable parameters include a programmable resistance, in which the calibration control circuit sequentially adjusts the programmable resistance between multiple resistances. In another configuration, the overtone crystal oscillator includes one or more amplifiers, each having a supply voltage input, where the programmable parameters include a programmable supply voltage provided to the supply voltage input of each amplifier. In this case, the calibration control circuit sequentially adjusts the programmable supply voltage between multiple voltage levels. In yet another configuration, the programmable parameters include both a programmable resistance and a programmable voltage for oscillator amplifiers. In a more specific configuration, the calibration control circuit adjusts the programmable resistance from a lowest resistance to a highest resistance for each of multiple voltage levels between a lowest voltage level and a highest voltage level.

The sensor may be configured in any suitable manner for sensing oscillation. In one configuration, the sensor includes a counter that counts clock cycles and determines oscillation if a predetermined minimum number of clock cycles is reached.

The calibration control circuit may include a stepper circuit and a digital to analog converter (DAC). The stepper circuit provides a first digital step value having multiple states. The DAC has an input receiving the first digital step value and an output providing a supply voltage which is provided to the supply voltage input of each amplifier of the oscillator. The supply voltage has a level that corresponds with the first digital step value. The stepper circuit may provide a second digital step value provided to a digital input of each programmable resistor.

The calibration control circuit may be controlled by a non-precision, low frequency clock. In this manner, the automatic calibration process may be controlled by a relatively noisy, non-precision and low frequency clock since it only serves to clock sequential logic or circuitry and clock a counter or the like, whereas the overtone crystal oscillator oscillates in the megahertz range or the like. The calibration control circuit may be configured to adjust the programmable parameter through each of the steps between a first value associated with a highest frequency bandwidth and a lowest gain state to a second value associated with a lowest frequency bandwidth and a highest gain state. The calibration control circuit may be configured to adjust closed-loop phase at a desired overtone frequency of the overtone crystal oscillator while only minimally modifying the closed-loop phase at a fundamental frequency of the overtone crystal oscillator.

An overtone crystal oscillator calibration system according to an embodiment of the present invention includes an overtone crystal oscillator and a calibration system. The overtone crystal oscillator has multiple programmable resistors and multiple amplifiers, where each amplifier has a supply voltage input. The calibration system adjusts the programmable resistors and the supply voltage inputs of the amplifiers and is configured to detect oscillation of the overtone crystal oscillator.

The overtone crystal oscillator may include a crystal and an RC network. The crystal has first and second terminals and has a fundamental resonance frequency and one or more overtone resonance frequencies. The amplifiers are coupled in series between the first and second terminals of the crystal. The RC network is coupled to the amplifiers and includes the programmable resistors. The amplifiers and RC network collectively configured to suppress oscillation of the crystal at its fundamental resonance frequency and to enable oscillation at an overtone resonance frequency with a least one combination of programmable resistance and supply voltage input.

In one configuration, the calibration system adjusts the programmable resistors and the supply voltage input for each of multiple sequential steps between a first step associated with a highest frequency bandwidth and a lowest gain state to a second step associated with a lowest frequency bandwidth and a highest gain state. In a more specific embodiment, the calibration system adjusts the supply voltage input of each amplifier between a minimum voltage level and a maximum voltage level, and adjusts the programmable resistors between a minimum resistance and a maximum resistance for each supply voltage level.

A method of automatic calibration for an overtone crystal oscillator according to an embodiment of the present invention includes configuring the overtone crystal oscillator with at least one programmable parameter for adjusting closed-loop frequency response of the overtone crystal oscillator, adjusting the at least one programmable parameter, and determining when the overtone crystal oscillator achieves oscillation. The method may include implementing the overtone crystal oscillator with at least one amplifier with a voltage supply input and adjusting the voltage supply input of each amplifier. The method may include implementing the overtone crystal oscillator with at least one programmable resistor and adjusting resistance of each resistor. The method may include adjusting resistance of each programmable resistor for each of multiple adjusted voltage levels of the voltage supply input. The method may include counting oscillation cycles and comparing with a predetermined count. The method may include configuring the overtone crystal oscillator with a programmable parameter that significantly adjusts closed-loop phase at a selected overtone frequency and that minimally adjusts the close-loop phase at a fundamental frequency.

Although the present invention has been described in considerable detail with reference to certain preferred versions thereof, other versions and variations are possible and contemplated. Those skilled in the art should appreciate that they can readily use the disclosed conception and specific embodiments as a basis for designing or modifying other structures for carrying out the same purposes of the present invention without departing from the spirit and scope of the invention as defined by the appended claims.

The invention claimed is:

1. An automatic calibration system for an overtone crystal oscillator, the overtone crystal oscillator having at least one programmable parameter for adjusting closed-loop frequency response of the overtone crystal oscillator and an oscillation node that oscillates upon oscillation of the overtone crystal oscillator, said automatic calibration system comprising:
a calibration control circuit which adjusts said at least one programmable parameter through each of a plurality of steps associated with frequency bandwidth; and
a sensor, for coupling to the oscillation node of the overtone crystal oscillator, which detects whether the overtone crystal oscillator achieves oscillation at any one of said plurality of steps;
wherein said calibration control circuit delays in each of said plurality of steps for a sufficient amount of time to determine whether oscillation is achieved and terminates calibration as soon as oscillation is determined to be achieved.

2. The automatic calibration system of claim 1, wherein the at least one programmable parameter comprises a programmable resistance, wherein said calibration control circuit adjusts said programmable resistance between a plurality of resistances.

3. The automatic calibration system of claim 1, wherein the overtone crystal oscillator comprises at least one amplifier, each amplifier having a supply voltage input, wherein the at least one programmable parameter comprises a programmable supply voltage provided to the supply voltage input of each amplifier, and wherein said calibration control circuit sequentially adjusts said programmable supply voltage between a plurality of voltage levels.

4. The automatic calibration system of claim 1, wherein the overtone crystal oscillator comprises at least one amplifier, each amplifier having a supply voltage input, wherein the at least one programmable parameter comprises a programmable supply voltage provided to the supply voltage input of each amplifier and a programmable resistance, and wherein said calibration control circuit adjusts said programmable resistance from a lowest resistance to a highest resistance for each of a plurality of voltage levels of said programmable supply voltage between a lowest voltage level and a highest voltage level.

5. The automatic calibration system of claim 1, wherein said sensor comprises a counter that counts clock cycles and determines oscillation if a predetermined minimum number of clock cycles is reached.

6. The automatic calibration system of claim 1, wherein the overtone crystal oscillator comprises at least one amplifier, each amplifier having a supply voltage input, and wherein said calibration control circuit comprises:
a stepper circuit which provides a first digital step value having a plurality of states; and
a digital to analog converter having an input receiving said first digital step value and an output providing a supply voltage which is provided to the supply voltage input of each amplifier, wherein said supply voltage has a level that corresponds with said first digital step value.

7. The automatic calibration system of claim 6, wherein the overtone crystal oscillator further comprises at least one programmable resistor coupled to the at least one amplifier, wherein each programmable resistor has a digital input for programming resistance, and wherein said stepper circuit provides a second digital step value provided to said digital input of each programmable resistor.

8. The automatic calibration system of claim 1, wherein said calibration control circuit is controlled by a clock having less precision than said overtone crystal oscillator.

9. The automatic calibration system of claim 1, wherein said calibration control circuit adjusts said at least one programmable parameter through each of a plurality of steps between a first value associated with a highest frequency bandwidth and a lowest gain state to a second value associated with a lowest frequency bandwidth and a highest gain state.

10. The automatic calibration system of claim 1, wherein said calibration control circuit adjusts closed-loop phase at a desired overtone frequency of the overtone crystal oscillator while only minimally modifying said closed-loop phase at a fundamental frequency of the overtone crystal oscillator.

11. An overtone crystal oscillator calibration system, comprising:
an overtone crystal oscillator having a plurality of programmable resistors and a plurality of amplifiers, each of said plurality of amplifiers having a supply voltage input; and
a calibration system which adjusts said plurality of programmable resistors and said supply voltage input of said plurality of amplifiers and which is configured to detect oscillation of said overtone crystal oscillator;
wherein said calibration system delays after each adjustment for a sufficient period of time to determine whether oscillation is achieved and terminates calibration as soon as oscillation is determined to be achieved.

12. The overtone crystal oscillator calibration system of claim 11, wherein said overtone crystal oscillator comprises:
a crystal having first and second terminals and having a fundamental resonance frequency and at least one overtone resonance frequency;
said plurality of amplifiers being coupled in series between said first and second terminals; and
a resistor and capacitor (RC) network coupled to said plurality of amplifiers including said plurality of programmable resistors;
wherein said plurality of amplifiers and said RC network are collectively configured to suppress oscillation of said crystal at said fundamental resonance frequency and to enable oscillation at said at least one overtone resonance frequency of said crystal with at least one combination of said plurality of programmable resistors and said supply voltage input.

13. The overtone crystal oscillator calibration system of claim 11, wherein said automatic calibration system adjusts said plurality of programmable resistors and said supply voltage input for each of a plurality of sequential steps between a first step associated with a highest frequency bandwidth and a lowest gain state to a second step associated with a lowest frequency bandwidth and a highest gain state.

14. The overtone crystal oscillator calibration system of claim 11, wherein said calibration system adjusts said supply voltage input of each of said plurality of amplifiers between a minimum voltage level and a maximum voltage level, and wherein for each of said plurality of sequential steps, said calibration system adjusts said plurality of programmable resistors between a minimum resistance and a maximum resistance for each voltage level of said supply voltage input of each of said plurality of amplifiers.

15. A method of automatic calibration for an overtone crystal oscillator, comprising:
configuring the overtone crystal oscillator with at least one programmable parameter that adjusts closed-loop frequency response of the overtone crystal oscillator;
adjusting the at least one programmable parameter through each of a plurality of adjustment settings;
delaying after each adjustment setting for a sufficient amount of time to determine whether oscillation occurs for a current adjustment setting; and
terminating said adjusting as soon as the overtone crystal oscillator is determined to achieve oscillation.

16. The method of claim 15, wherein said configuring the overtone crystal oscillator comprises implementing the overtone crystal oscillator with at least one amplifier with a voltage supply input and wherein said adjusting comprises adjusting the voltage supply input of each amplifier.

17. The method of claim 15, wherein said configuring the overtone crystal oscillator comprises implementing the overtone crystal oscillator with at least one programmable resistor and wherein said adjusting comprises adjusting resistance of the at least one programmable resistor.

18. The method of claim 15, wherein said configuring the overtone crystal oscillator comprises implementing the overtone crystal oscillator with at least one amplifier with a voltage supply input with at least one programmable resistor and wherein said adjusting comprises adjusting at least one of the voltage supply input of each amplifier and resistance of the at least one programmable resistor.

19. The method of claim 18, wherein said adjusting comprises adjusting resistance of the at least one programmable resistor for each of a plurality of adjusted voltage levels of the voltage supply input.

20. The method of claim 15, wherein said determining when the overtone crystal oscillator achieves oscillation comprises counting oscillation cycles and comparing with a predetermined count.

21. The method of claim 15, wherein said configuring the overtone crystal oscillator with at least one programmable parameter that adjusts closed-loop frequency response of the overtone crystal oscillator comprises configuring the overtone crystal oscillator with a programmable parameter that significantly adjusts closed-loop phase at a selected overtone frequency and that minimally adjusts the close-loop phase at a fundamental frequency.

* * * * *